(12) United States Patent
Moench et al.

(10) Patent No.: US 10,680,411 B2
(45) Date of Patent: Jun. 9, 2020

(54) LASER SENSOR MODULE (71) Applicant: PHILIPS PHOTONICS GMBH, Ulm (DE)

(72) Inventors: Holger Moench, Eindhoven (NL); Alexander Marc Van Der Lee, Eindhoven (NL); Stephan Gronenborn, Eindhoven (NL)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 252 days.

(21) Appl. No.: 15/536,905

(22) PCT Filed: Dec. 11, 2015

(86) PCT No.: PCT/EP2015/079396
§ 371 (c)(1),
(2) Date: Jun. 16, 2017

(87) PCT Pub. No.: WO2016/096647
PCT Pub. Date: Jun. 23, 2016

(65) Prior Publication Data
US 2019/0097393 A1 Mar. 28, 2019

(30) Foreign Application Priority Data
Dec. 19, 2014 (EP) ..................... 14199083

(51) Int. Cl.
*H01S 5/18* (2006.01)
*H01S 5/183* (2006.01)
(Continued)

(52) U.S. Cl.
CPC ........ *H01S 5/18361* (2013.01); *G01S 7/4865* (2013.01); *G01S 17/10* (2013.01);
(Continued)

(58) Field of Classification Search
CPC ........ G01S 7/4811; G01S 7/487; G01S 7/497; G01S 17/10; G01S 7/4868
See application file for complete search history.

(56) References Cited

U.S. PATENT DOCUMENTS 6,751,245 B1   6/2004  Wasserbauer et al.
2002/0176459 A1  11/2002  Martinsen
(Continued)

FOREIGN PATENT DOCUMENTS

JP    2001315381 A   11/2001
JP    2005136155 A    5/2005
(Continued)

OTHER PUBLICATIONS

Gordon "Thermally Controlled Onset of Spatially Incoherent Emission in a Broad-Area Vertical-Cavity Surface-Emitting Laser", IEEE Journal of Selected Topics in Quantum Electronics ( vol. 15 , Issue: 3 , May-Jun. 2009) (Year: 2009).*
(Continued)

*Primary Examiner* — Luke D Ratcliffe
(74) *Attorney, Agent, or Firm* — Leydig, Voit & Mayer, Ltd.

(57) ABSTRACT

The invention describes a laser sensor module comprising at least one Vertical Cavity Surface Emitting Laser (100) and at least one driving circuit (120). The driving circuit (120) is adapted to provide electrical energy to the Vertical Cavity Surface Emitting Laser (100) such that the Vertical Cavity Surface Emitting Laser (100) emits laser pulses (345) with a pulse length (356) of less than 100 ns and a duty cycle of less than 5% in comparison to a continuous laser emission. The driving circuit (120) is further adapted to provide additional energy to the Vertical Cavity Surface Emitting Laser (100) at least 100 ns prior to at least a part of the laser pulses (345) such that the part of the laser pulses (345) are emitted under defined optical conditions. The invention
(Continued)

further describes a distance detection device comprising the laser sensor module and a method of driving the laser sensor module. The additional energy is preferably provided by means of a current pre-pulse (335) which is applied to the V(E)CSEL prior to preferably each laser pulse (345). The current pre-pulse is preferably arranged such that no laser light is emitted by means of the V(E)CSEL. The V(E)CSEL are enabled to emit the laser pulses (345) under defined optical conditions such that the time of emission and the pulse shape of the laser pulses (345) is well defined. Well defined time of emission and the pulse shape of the laser pulses (345) enable a reliable detection of reflected laser light (117) which corresponds to the emission of the respective laser pulse (345).

14 Claims, 5 Drawing Sheets

(51) Int. Cl.
*H01S 5/062* (2006.01)
*H01S 5/42* (2006.01)
*G01S 7/4865* (2020.01)
*G01S 17/10* (2020.01)
*H01S 5/024* (2006.01)
*H01S 5/042* (2006.01)
*H01S 5/14* (2006.01)

(52) U.S. Cl.
CPC ...... *H01S 5/02469* (2013.01); *H01S 5/06216* (2013.01); *H01S 5/18305* (2013.01); *H01S 5/423* (2013.01); *H01S 5/0428* (2013.01); *H01S 5/141* (2013.01); *H01S 5/18386* (2013.01)

(56) References Cited

U.S. PATENT DOCUMENTS

| | | |
|---|---|---|
| 2003/0219048 A1 | 11/2003 | Couch |
| 2007/0053402 A1 | 3/2007 | Braunecker |
| 2010/0098119 A1 | 4/2010 | Schemann et al. |
| 2010/0123895 A1 | 5/2010 | Reiner et al. |
| 2011/0228037 A1 | 9/2011 | Omori et al. |
| 2012/0250713 A1 | 10/2012 | Maeda et al. |
| 2014/0269793 A1 | 9/2014 | Haden et al. |
| 2014/0350836 A1 | 11/2014 | Stettner et al. |
| 2015/0063387 A1* | 3/2015 | Joseph ............... H01S 5/02438 372/36 |
| 2015/0288145 A1* | 10/2015 | Fattal ................. H01S 5/18363 372/45.01 |

FOREIGN PATENT DOCUMENTS

| | | |
|---|---|---|
| JP | 2007311616 A | 11/2007 |
| JP | 2007533962 A | 11/2007 |
| JP | 2008538163 A | 10/2008 |
| JP | 2010151958 A | 7/2010 |
| JP | 2011216843 A | 10/2011 |

OTHER PUBLICATIONS

Craggs G et al: "Thermally Controlle(d Dnset of Spatially Incoherent Emission in a Broa(d-Area Vertical-Cavity Surface-Emitting Laser",IEEE Journal of Selected Topics in Quantum Electronics, IEEE Service Center, Piscataway, NJ, US,vol. 15, No. 3, May 1, 2009 (May 1, 2009),pp. 555-562.

Michael Peeters et al: "Spatial decoherence of pulsed broad-area vertical-cavity surface-emitting lasers", Opt. Express, vol. 13, No. 23 Nov. 14, 2005 (Nov. 14, 2005), pp. 9337-9345, XP055196185,Retrieved from the Internet:URL:https://www.osapublishing.org/DirectPD FAccess/DCIE167D-0048-BD40-086C16462A4FF9FC_86218/oe-13/23/9337.pdf?da=1&id=86218&seq=0&mobile=no[retrieved on Jun. 16, 2015]p. 9339.

M0ench Holger et al:"High power electrically pumped VECSELs and arrays", Optomechatronic Micro/Nan0 Devices and Components III : Oct. 8-10, 2007, Lausanne, Switzerland; [Proceedings of SPIE , ISSN 0277-786X], SPIE, Bellingham, Wash,vol. 8966, Mar. 3, 2014 (Mar. 3, 2014), pp. 89660H-89660H.

Mandre Shyam et al: "Determining the temporally and radially resolved temperature distribution inside a pulsed broad-area vertical-cavity surface-emitting laser cavity", Applied Physics Letters, American Institute of Physics, US, vol. 89, No. 15, Oct. 9, 2006 (Oct. 9, 2006), pp. 151106-151106.

\* cited by examiner

LASER SENSOR MODULE

CROSS-REFERENCE TO PRIOR APPLICATIONS

This application is the U.S. National Phase application under 35 U.S.C. § 371 of International Application No. PCT/EP2015/079396, filed on Dec. 11, 2015, which claims the benefit of EP Patent Application No. EP 14199083.8, filed on Dec. 19, 2014. These applications are hereby incorporated by reference herein.

FIELD OF THE INVENTION

The invention relates to a laser sensor module, a distance detection device comprising the laser sensor module and a method of driving the laser sensor module.

BACKGROUND OF THE INVENTION

Time of flight methods are an established way to measure the distance in 3D space; especially on longer distances this technology is often called LIDAR (equiv. RADAR). Short pulses (1-10 ns) or sequences of pulses (pulse trains) of light are sent out and the time until reflected light returned is measured. Repetition rates are relatively low in order to limit total power but must be high enough to allow for scan/frame rates sufficient for a safety relevant function. In combination with a scanning mirror a very good angular resolution can be achieved. Pulse trains are used in order to simplify the identification of the detected laser light by comparing the pattern of the emitted pulse train with the pattern of the received pulse train. The required brightness can only be achieved by specialized solid-state or edge emitting lasers.

SUMMARY OF THE INVENTION

It's thus an object of the present invention to provide an improved laser sensor module.

According to a first aspect a laser sensor module for time of flight measurements comprising at least one Vertical Cavity Surface Emitting Laser (VCSEL) or Vertical Extended Cavity Surface Emitting Laser (VECSEL) and at least one driving circuit is provided. The driving circuit is adapted to provide electrical energy to the Vertical Cavity Surface Emitting Laser or Vertical Extended Cavity Surface Emitting Laser such that the Vertical Cavity Surface Emitting Laser or Vertical Extended Cavity Surface Emitting Laser emits laser pulses with a pulse length of less than 100 ns and a duty cycle of less than 5% in comparison to a continuous laser emission. The driving circuit is further adapted to provide additional energy to the Vertical Cavity Surface Emitting Laser or Vertical Extended Cavity Surface Emitting Laser at least 100 ns prior to at least a part of the laser pulses such that the part of the laser pulses are emitted under defined optical conditions.

Time of flight measurements which may be performed with the laser sensor module need high beam qualities. The laser light has to be emitted at a precise moment in time. Long or even varying delays between electrical pulses provided by the driving circuit and the respective laser pulses have to be avoided. Variation of the laser pulse like jitter or the like should be minimized. The power output during a laser pulse has to be relatively stable. The VCSEL or VECSEL (V(E)CSEL) has to operate in a stable mode, preferably the fundamental mode during the laser pulse. The beam quality is needed in order to enable a reliable detection of reflected light of a particular laser pulse. Because of the importance of the beam quality and of stable laser modes the V(E)CSEL should be preferably either a top emitter with relatively small diameter and single mode emission or a bottom emitting V(E)CSEL i.e. with an extended cavity enforcing almost fundamental mode emission over a wide range of diameters of e.g. 20-500 μm. The laser pulses may be a single pulses or sequences of pulses (pulse trains) which may be used to identify the emitted laser light by means of the pattern of the pulse train.

Experimental results of VCSEL operating at low duty cycles of less than 5% or repetition frequencies below 5 MHz in combination with short pulse length of less than 100 ns show that the VCSEL do not provide beam qualities which are needed for reliable time of flight measurement. Even the combination of the VCSEL with an external feedback element like a flat mirror in order to provide a Vertical Extended Cavity Surface Emitting Laser (VECSEL) does not provide the required beam quality. It is clarified that a VCSEL which is combined with an external feedback is not necessarily enabled to emit laser light without the feedback of the external feedback. It could be shown by experiments that the application of additional energy by the driving circuit characterized by a specific current shape before the nominal laser pulse may enable laser light emitted within the part of the laser pulses such that a time of flight measurement of a distance to an object is enabled by means of the part of the laser pulses is improved. The additional energy seems to enable a single mode operation of the VCSEL essentially without jitter especially at the beginning of the laser pulses. The power ramp up of the laser pulse follows the shape of the electrical current provided by the driving circuit such that the delay between electrical pulse and laser pulse is avoided or at least minimized to an acceptable level. The additional energy may be provided by means of optical energy or preferably by means of electrical energy because the losses and the additional technical measures as mirrors and the like to provide the optical energy within the emission path of the VCSEL especially near to the laser cavity of the VCSEL may be too high. The additional energy may be provided prior to each laser pulse or only a part of the laser pulses emitted by the VCSEL.

The driving circuit may comprise any circuit arrangement comprising one or more processor or micro-processor and one or more memory device which is provided in an integrated arrangement with the at least one V(E)CSEL or a distributed arrangement in which the V(E)CSEL is electrically driven by means of another device which comprises the functionality of the driving circuit.

The laser pulses may have a pulse length of less than 100 ns, preferably a pulse length of less than 20 ns and more preferably of less than 10 ns. The repetition rate or frequency of the laser pulses is adapted to the pulse length (or vice versa) such that the condition with respect to the duty cycle of less than 5% is fulfilled. The repetition frequency is preferably below 1 MHz or even below 100 kHz. The duty cycle may preferably be less than 1% or 0.2% of a continuous wave (cw) operation of the VCSEL.

The driving circuit is adapted to provide a pre-current to the Vertical Cavity Surface Emitting Laser in which no laser light is emitted prior to the part of the laser pulses.

The pre-current which is provided via the electrodes of the VCSEL provides additional energy to the VCSEL in order to enable stable operation during emission of the laser pulses. Experimental investigations show that especially for short laser pulses of less than 20 ns there is a substantial delay between the beginning of the electrical pulse and the beginning of the laser pulse. Experiments with various sub-threshold pre-currents or current ramp up schemes in the ns or few 10 ns regime do not solve the problem. Pre-currents which are started at least 100 ns, preferably at least 0.5 µs and most preferably at least 1 µs prior to the electrical pulse for generating the laser pulse show an improvement of laser stability and a reduction of the delay. The pre-current is adapted such that no laser light is generated shortly before the laser pulse starts in order to avoid ambiguities in the detection of the raising laser slope of the laser pulse which has to be detected.

The starting time of the pre-current and the amount of energy provided during the pre-current influence the delay and the beam quality of the subsequent laser pulse. It is thus believed that the pre-current if provided in a well-adapted way provides a smooth temperature profile or more precisely a smooth radial temperature gradient across a laser aperture of the Vertical Cavity Surface Emitting Laser such that a thermal lens is formed at the laser aperture.

The laser aperture is defined by the region at which charge carriers are injected in the active area of the VCSEL between a bottom and top mirror. The laser aperture may be defined by means of an oxide aperture for current confinement or other measures (e.g. ion implantation or heterostructures and/or shape and position of electrodes) for confining the current. The pre-current provides a heating of the region of current flow due to ohmic losses and absorption of the generated photons. The heat generated by means of the pre-current dissipates after starting the pre-current. The temperature profile after some microseconds depends on the relative loss power integrated over a certain time. The temperature profile strongly depends on the layer structure of the VCSEL, size of the laser aperture, thickness of the layers, material of the layers, thickness of the substrate, electrode configuration and measures to dissipate heat as, for example, a heat sink. The energy needed to provide the smooth temperature profile or more precisely a smooth radial temperature gradient may depend on the repetition frequency, pulse length and pulse height of the laser pulses or more generally spoken the thermal history of the VCSEL. The more thermal energy is provided by means of ohmic and also optical losses caused by the electrical pulses generating the laser pulses the less energy has to be provided by the pre-current. It may be even sufficient at high repetition rates to provide a pre-current only in every second or third interval between the laser pulses.

Experiments in combination with thermal simulations show that the smooth temperature profile or more precisely a smooth radial temperature gradient across the laser aperture building the thermal lens may be characterized by a temperature difference between a center of the laser aperture and a rim of the laser aperture at the beginning of emission of the part of the laser pulses being at least 2 K preferably at least 5 K and most preferably at least 10 K. The center and rim of the aperture may be defined by a current aperture provided by means of oxidization of one or more layers of the VCSEL or other measures as described above.

The pre-current may comprise a constant offset or bias current provided between two laser pulses. The offset current has to be below the laser threshold in order to avoid lasing prior to the subsequent laser pulse. The laser threshold is defined throughout the application as the current which is needed to start lasing if the V(E)CSEL is optimally prepared by means of the pre-current in the subsequent laser pulse. The offset current is preferably below 50% of the laser threshold current, more preferably below 30% of the laser threshold current and most preferably below 20% of the laser threshold current. The constant offset current may be easily implemented but may require more energy in order to generate the required temperature profile. The constant offset current may be advantageous at relatively high duty cycles between 1% and 5% in which less energy may be needed in order to generate the smooth temperature profile or more precisely a smooth radial temperature gradient and in which the time period between subsequent laser pulses is shorter. The offset current is also advantageous if the need for more energy and the related higher thermal losses are not considered as a disadvantage as e.g. at environmental temperatures below the optimum operating range of the laser. In this case the extra energy helps to stabilize the laser at its preferred temperature.

The pre-current may in an alternative approach comprise at least one current pre-pulse between two subsequent laser pulses. The current pre-pulse is characterized by means of pulse length which is shorter than the period between two subsequent laser pulses. There is at least a gap at which no current is provided to the VCSEL by means of the driving circuit between a first laser pulse of the two subsequent laser pulses and the current pre-pulse. The pulse shape of the current pre-pulse may have any shape which may be suited to enable stable lasing during the laser pulses as discussed above. The pre-current may comprise one, two three or more current pre-pulses (pulse train). The current pre-pulses may have the advantage that the energy can be provided in a very controlled way such that the energy which is needed to enable stable and reliable laser pulses is minimized. Timing, number of current pre-pulses, pulse shape and length of the current pre-pulse can be adapted to the physical boundary conditions of the respective VCSEL as the layer structure of the VCSEL, size of the laser aperture, thickness of the layers, material of the layers, thickness of the substrate, electrode configuration and measures to dissipate heat as, for example, a heat sink and the like. It may also be possible to combine an offset current with a current pre-pulse.

Experimental results in combination with simulations show that the current pre-pulse has to start at least 0.1 µs prior to the subsequent laser pulse in order to enable a smooth temperature profile or more precisely a smooth radial temperature gradient across the current aperture. This relatively short time period may apply in situations when the laser aperture is small and the active area or zone is near to a heat conducting structure as a sub-mount. The distance between active area and sub-mount may in this case be in the range of 5 µm such that a local temperature rise will reduce fast. Furthermore, details also depend on the heat loss. If e.g. the losses already follow a Gaussian shape the smooth temperature profile or more precisely a smooth radial temperature gradient and therefore the thermal lens can be established sooner. In other situations it may be advantageous to start the current pre-pulse 0.5 µs, 2 µs or even 10 µs prior to the subsequent laser pulse.

The driving circuit may be further adapted to provide a time gap of at least 10 ns more preferably at least 50 ns between the current pre-pulse and the laser pulse emitted after the current pre-pulse in which the peak current is less than 50% of the laser threshold current of the Vertical Cavity Surface Emitting Laser is provided to the Vertical Cavity Surface Emitting Laser. The electrical energy provided by the pre-pulse is reduced during the time gap. It may even be preferred to provide no electrical current to the VCSEL by means of the driving circuit within the time gap. The time gap may even comprise a period of 100 ns and more in which no current is provided to the VCSEL. The time gap may especially in case of big differences in the temperature profile caused by the current pre-pulse be advantageous in order to get a smooth temperature profile or more precisely a smooth radial temperature gradient across the laser aperture forming the thermal lens.

The current pre-pulse may comprise maximum current amplitude which is lower than the laser threshold current of the Vertical Cavity Surface Emitting Laser. No laser light is emitted in this case independent of the length of the current pre-pulse.

The current pre-pulse may alternatively comprise a maximum current amplitude which is higher than the laser threshold current of the Vertical Cavity Surface Emitting Laser would be if the thermal lens would have developed already in an optimum way. Experimental results show that it is possible to provide short and relatively high current pulses without any lasing of the VCSEL. In specific cases it may be even possible that the pre-pulse is similar to the laser-pulse but does not allow any laser operation because of the missing thermal conditioning. Current pre-pulses comprising a maximum current amplitude which is higher than the laser threshold current of the Vertical Cavity Surface Emitting Laser may enable to provide a large amount of energy within a short time period and may help to minimize the energy needed to enable lasing under defined optical conditions.

The Vertical Cavity Surface Emitting Laser may comprise at least one heat management structure. The heat management structure may be adapted to support establishing of the smooth temperature or more precisely a smooth radial temperature gradient across the laser aperture of the Vertical Cavity Surface Emitting Laser between two subsequent laser pulses. For VCSELs and especially high power VCSELs it is ideal to choose the composition of the DBRs and all assembly materials as well as the geometry of metallic contacts in order to maximize the thermal conductivity. For the operation with short pulses and relatively low duty cycle it has turned out that the demand for ideal heat removal can be sacrificed in order to create the desired temperature profiles with minimum power which has to be provided by means of the pre-current. In the device design this means that ternary AlGaAs compounds may be used rather than the binaries, thicker layers may be advantageous and the device geometry may be designed towards the goal of the defined temperature profile achieved with minimum heat in order to build up the thermal lens. The thickness of the substrate may be of special importance as the thermal lens builds up in this volume in case of a bottom emitter, i.e. the general rule "the thinner the better" doesn't hold and an ideal substrate thickness has to be chosen based on absorption, pulse length and repetition rate as well as the desired properties of the laser cavity i.e. the strength of the thermal lens.

It can be especially advantageous to process the VCSELs not in the shape of free standing and exposed mesas as normally done but to allow a better heat conduction from the rim of the aperture because the temperature profile is established by heat deposition in the center of the laser aperture and good heat removal around the edge or rim of the laser aperture. Local heat removal at the edges of the laser aperture may be increased e.g. by "hole etching" or by a good thermal contact of the mesa flanks to e.g. a surrounding metal layer. While it may be advantageous to make the electrical contact diameter smaller than the aperture it may help to have a thermal contact which is of the same size or even larger than the aperture. This may be realized e.g. by making a large metal contact on the GaAs surface which only the center part has a good electrical contact. In normal VCSEL design the last GaAs layer is highly doped in order to enable such a good contact to the metal. A practical measure to have good electrical conductivity only in the center but good heat conductivity across a large contact may be to etch away the outer part of the (very thin i.e. 20-80 nm) highly doped GaAs layer.

The Vertical Cavity Surface Emitting Laser may be a Vertical Extended Cavity Surface Emitting Laser comprising an optical feedback element. The optical feedback element may, for example, be a planar mirror or a curved mirror. A curved mirror for focusing the laser light to the laser cavity may have the disadvantage that precise alignment with respect to the laser cavity may be needed.

The laser sensor module may comprise an array of Vertical Cavity Surface Emitting Lasers. The driving circuit may in this case be adapted to provide a pre-current to at least a part of the Vertical Cavity Surface Emitting Lasers of the array, wherein the pre-current may be adapted to the relative position of the Vertical Cavity Surface Emitting Laser within the array to which the pre-current is provided such that different pre-currents are provided to at least a first and a second Vertical Cavity Surface Emitting Laser of the array. The pre-current may be an offset current or a current pre-pulse. The different pre-currents may especially helpful with respect to VCSEL positioned at the edge or rim of an array and VCSEL positioned within the array as discussed below.

The laser sensor may alternatively comprise an array of Vertical Cavity Surface Emitting Lasers, wherein the driving circuit is adapted to provide a current pre-pulse to at least a part of the Vertical Cavity Surface Emitting Lasers of the array, and wherein the current pre-pulse is adapted such that Vertical Cavity Surface Emitting Lasers which are controlled by the driving circuit to emit laser pulses simultaneously start lasing within a predefined time period, the predefined time period being related to a thermal cross talk between neighboring Vertical Cavity Surface Emitting Lasers which are controlled to emit the laser pulse simultaneously.

Array design may have an important influence with respect to the conditions of emitting laser light. Close proximity of nearest neighbor VCSELs or VECSELs in the array reduces the built up of gradients in the temperature profile. In the application of a VCSEL or VECSEL array as one single light source for time of flight measurements in a three dimensional environment (LIDAR) it would be especially critical if some VCSEL or VECSELs start to lase earlier than others because their thermal lens is supported by a larger temperature profile (e.g. at the edges of an array). It may be advantageous to adapt the current pre-pulse with a duration just long enough to establish a smooth temperature profile or more precisely a smooth radial temperature gradient across the aperture, but short enough (and not separated in time too much) to minimize thermal cross talk especially between adjacent mesas. This "tailoring" can only be achieved by current pre-pulses as any offset current or remaining heat from history will result in the long time diffusion equilibrium favoring the thermal lens at the edges of the array.

According to a further aspect an improved distance detection device is provided. The distance detection device comprises at least one laser sensor module as described above and at least one photo-detector. The photo-detector is adapted to receive reflected laser light of at least one laser pulse. The distance detection device further comprises an evaluator. The evaluator is adapted to identify reflected laser light of a corresponding laser pulse, and the evaluator is further adapted to determine a time of flight between a time of reception of the reflected laser light and a time of emission of the corresponding laser pulse.

The distance detection device may further comprise optical means as, for example, lenses, mirrors or one or more scanning unit (e.g. MEMS mirror array) and the like which are adapted to direct the laser pulses to the intended target region. The laser sensor module may comprise a single VCSEL or VECSEL, a linear array to emit, for example, a fan of laser pulses or a two dimensional array.

According to a further aspect an improved method of driving a laser sensor module for time of flight measurements comprising at least one Vertical Cavity Surface Emitting Laser is provided. The method comprises the steps of:

providing electrical energy to the Vertical Cavity Surface Emitting Laser such that the Vertical Cavity Surface Emitting Laser emits laser pulses with a pulse length of less than 100 ns and a repetition rate of less than 5% in comparison to a continuous laser emission;

providing additional energy by means of a pre-current to the Vertical Cavity Surface Emitting Laser such that at least a part of the laser pulses are emitted under defined optical conditions adapting the pre-current such that a smooth temperature profile is established across a laser aperture of the Vertical Cavity Surface Emitting Laser such that a thermal lens is formed at the laser aperture such that the laser light emitted within the part of the laser pulses is characterized by a current shape provided by the driving circuit such that a time of flight measurement of a distance to an object is enabled by means of the part of the laser pulses.

The method may further comprise the additional steps of:

determining a first thermal energy generated in the Vertical Cavity Surface Emitting Laser during emission of the laser pulse;

determining the additional energy to be provided;

determining a pulse shape of a pre-current based on the determined additional energy.

The additional energy is thermal energy which is needed to enable the defined optical conditions at a time of emission of the laser pulse emitted after the pre-current depending on the first thermal energy and the repetition rate. The additional energy may further be determined based on ambient conditions like the ambient temperature, a heat sink temperature of a heat sink adapted to cool the respective VCSEL or additional parameters which may be relevant as, for example, a position of a VCSEL or VECSEL in an array.

The additional energy and consequently the pre-current may be used to compensate for a wide range of heat sink temperatures (i.e. ambient temperatures) which is especially important for an application in an automobile. In this case the VCSEL or VECSEL should be designed in an optimal way for the operation in the region of the higher temperatures (e.g. 80° C.). Means for detection of the temperature or temperatures may be, for example, a thermocouple connected to the driver or by analyzing the electrical series resistance of the VCSEL or VECSEL. If the ambient temperature is low the pre-current may be adapted in a way to increase the overall temperature of the VCSEL or VECSEL assembly in addition to enabling the smooth temperature profile as described above. For this purpose more heat and on a longer time scale has to be provided. The longer time scale has to be sufficient to allow heat conduction across the whole VECSEL structure i.e. >>1-10 μs. Furthermore, the pulse shape of the pre-current may be more complex. The overall heating may, for example, be provided by means of an offset current with relatively low current amplitude. The heat for the thermal lens may be provided by means of a relatively short current-pre pulse as described above.

It shall be understood that the laser sensor module according to claims 1-12 and the method of claims 14 and 15 have similar and/or identical embodiments, in particular, as defined in the dependent claims.

According to a further aspect a computer program product is provided. The computer program product comprises code means which can be saved on at least one memory device (RAM etc.) of the driver circuit of the laser sensor module according to any one of claims 1-12, wherein the code means are arranged such that the method according to any one of the claim 14 or 15 can be executed by means of one or more processing devices like processors or microprocessors of the driving circuit.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
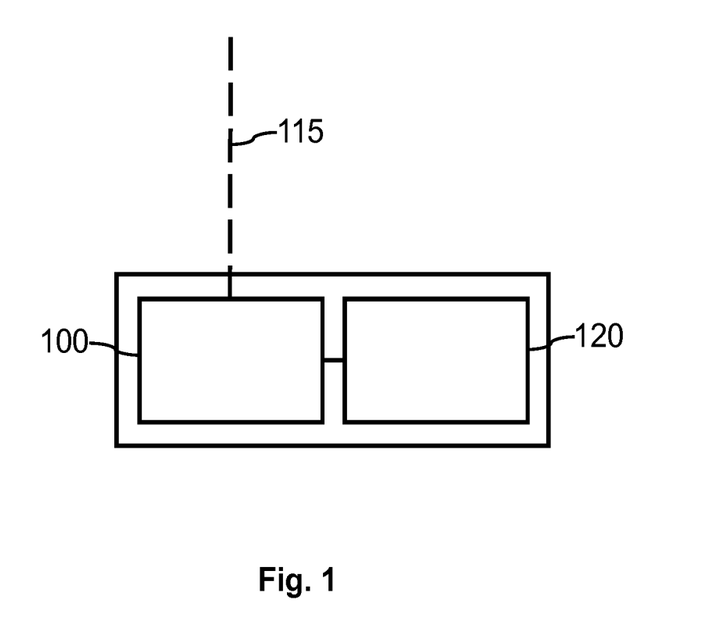
FIG. 1 shows a principal sketch of a first embodiment of the laser sensor module

FIG. 1 shows a principal sketch of a first embodiment of the laser sensor module. The laser sensor module comprises a VCSEL 100 and a driving circuit 120 for electrically driving the VCSEL 100. The driving circuit 120 is electrically connected to the VCSEL 100 to provide electrical power to the VCSEL 100 in a defined way. The driving circuit 120 comprises a memory device for storing data and instructions to operate the driving circuit 120 and a processing unit for executing data and instructions to operate the driving circuit 120. The driving circuit 120 comprises a data interface for submitting and receiving data to and from external devices. The external device may be an evaluation unit for receiving information about emitted laser light 115 or control parameters for driving the VCSEL. The external device may be a sensor like a thermo couple which provides information about ambient temperatures which may be used to adapt the control parameters for driving the VCSEL. The driving circuit 120 may be further adapted to determine the status of the VCSEL by performing, for example, resistance measurements in order to determine the temperature of the VCSEL during operation. The driving circuit 120 may further be adapted to measure, receive and analyze any information which may be relevant to determine a driving or pulse scheme for operating the VCSEL 100 in relation to the status of the VCSEL previous to or during operation.

Figure 2:
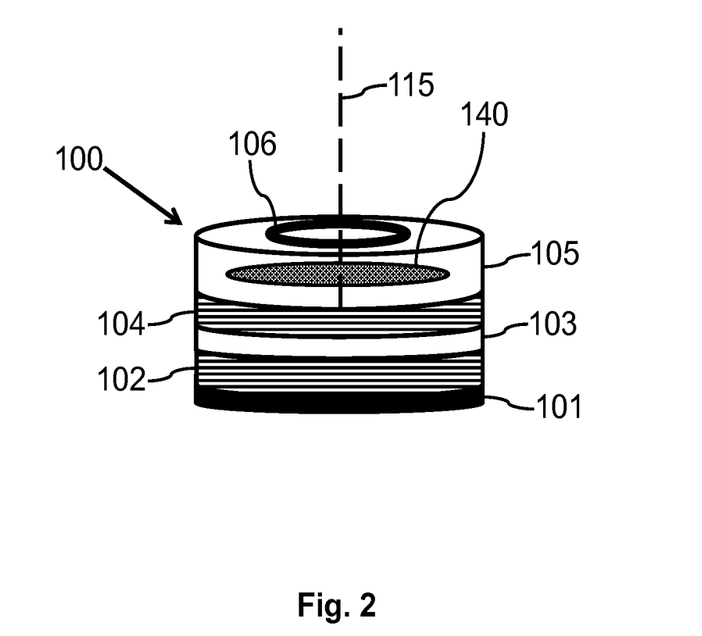
FIG. 2 shows a principal sketch of a layer structure of a VCSEL

FIG. 2 shows a principal sketch of a layer structure of a VCSEL 100. The emitted laser light 115 is emitted via a substrate 105 which may be a Gallium arsenide (GaAs) substrate. The VCSEL 100 is therefore a so called bottom emitter. The VCSEL comprises a first electrode 101 and a first Distributed Bragg Reflector (DBR) 102 mechanically coupled with the first electrode 101. The VCSEL further comprises an active layer 103 which is a semiconductor layer arrangement arranged between the first DBR 102 and a second DBR 104. The first DBR 102, the active area 103 and the second DBR define the laser cavity of the VCSEL 100 in which the laser light is generated. The second DBR 104 is mechanically coupled to the substrate 105 of the VCSEL. A ring shaped second electrode 106 is mechanically coupled to a top side of the substrate 105. It may also be possible to provide an electrode layer in which a hole is provided through which the laser light is emitted instead of the ring shaped second electrode 106. There may be additional layers between the first electrode 101 and the first DBR 102, between the first DBR 102 and the active area 103, between the active area 103 and the second DBR 104, between the second DBR 104 and the substrate and between the substrate 105 and the second electrode 106 which are not shown. Such layers may be one or more oxide apertures which may be preferably provided close to the active area 103 in order to confine the current. The oxide apertures may be, for example, circular such that a diameter of the oxide aperture defines the laser aperture of the VCSEL. Ohmic losses of the electrical current from the first electrode 101 to the second electrode 106 as well optical losses caused by the emitted light directly heat the volume through which the electrical current flows and through which the laser light is emitted. The ambient volume of the VCSEL is indirectly heated by means of dissipating heat. The heat caused by the losses and the dissipating heat result after some time in a smooth temperature profile or more precisely a smooth radial temperature gradient across the laser aperture with a maximum temperature at the middle or center of the laser aperture and somewhat lower temperature at the rim of the laser aperture. This temperature profile results in a variation of the refractive index within the material such that a thermal lens 140 is built up. Basic description of VCSEL and VECSEL and design choices incl. the background for the thermal lens concept can be found in "Semiconductor Disk Lasers" (ed. O. Ohkotnikov, Wiley 2010) in Chapter 7 which is incorporated by reference. Main parts of the thermal lens 140 are located in the substrate 105 of the bottom emitting VCSEL or VECSEL (V(E)CSEL). The thermal lens would be located within the first DBR 102 and intermediate layers which would be located between the first DBR 102 and the first electrode 101 in case of a top emitting V(E)CSEL. It is believed that the thermal lens 140 is essential to define a stable resonator and therefore the selection of stable laser modes in order to enable a precise time of flight measurement. The change of the lens and therefore the resonator due to temperature changes makes it more difficult to identify emitted laser light 115 which is emitted by a VCSEL. The situation is even worse in case of VECSEL in which the thermal lens 140 influences the optical feedback provided by a feedback element 130 (see FIG. 3) and thus the time at which the VECSEL starts lasing.

Figure 3:
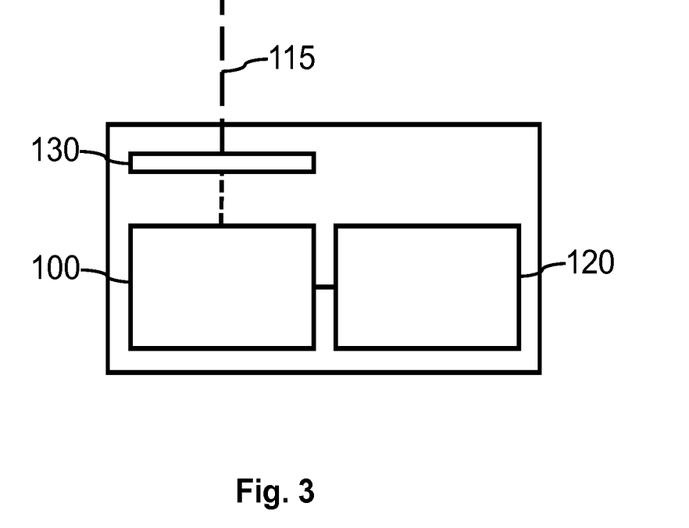
FIG. 3 shows a principal sketch of a second embodiment of the laser sensor module

FIG. 3 shows a principal sketch of a second embodiment of the laser sensor module. The laser sensor module comprises a VCSEL 100, a feedback element 130 which may be a flat mirror with a reflectivity of around 95% and a driving circuit 120 for electrically driving the VCSEL 100. The VCSEL 100 and the flat mirror build a VECSEL in which the laser cavity and the flat mirror build an extended cavity. The reflectivity of the second DBR 104 is designed such that there is no lasing without the feedback provided by the flat mirror. The reflectivity of the flat mirror which is needed for lasing depends on the reflectivity of the second DBR and can be varied in a broad range. VECSEL are mainly used for high power applications. The functionality of the driving circuit 120 is the same as discussed with respect to the first embodiment shown in FIG. 1.

Figure 4:
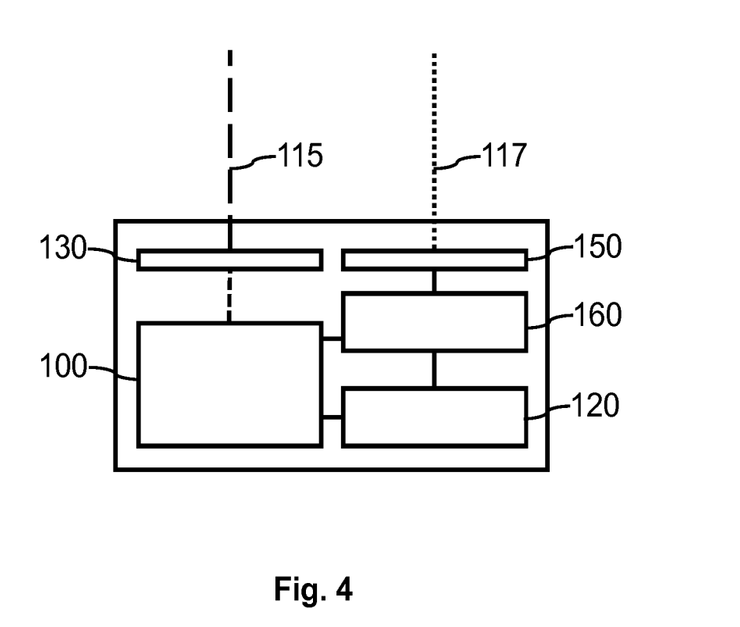
FIG. 4 shows a principal sketch of a first embodiment of a distance detection device

FIG. 4 shows a principal sketch of a first embodiment of a distance detection device. The distance detection device comprises a laser sensor module similar as the second embodiment discussed with respect to FIG. 3. The distance detection device further comprises a photo detector 150 and an evaluator 160. The photo detector 150 is in this case a photo diode but may be any preferably semiconductor device which can be used to detect laser light emitted by the VECSEL. The photo detector should be as sensitive as possible for the photons emitted by the laser and should have a fast measurement time. A preferred technology are e.g. avalanche photodiodes or even more so called SPADs (single photon avalanche diodes) as well as arrays of the same. The evaluator 160 comprises at least one memory device like a memory chip and at least one processing device like a micro-processor. The processing device is adapted to receive data from the driving circuit 120 and optionally from the VCSEL 100 in order to determine a time $t_1$ at which emitted laser light 115 leaves the extended cavity in the form of a laser pulse 345 (see e.g. FIG. 5) with a pulse length 356 (see e.g. FIG. 5) of 5 ns. The evaluator 160 further determines based on this time $t_1$ and the repetition rate provided by means of the driving circuit 120 whether reflected laser light 117 detected by the photo diode originates from the laser pulse emitted at time $t_1$. A time $t_2$ is recorded if the reflected laser light 117 originates from the laser pulse and the distance to the object which reflected the laser pulse is calculated by means of the time of flight $\Delta t = t_2 - t_1$ and the velocity of the laser pulse c. The determination of $t_1$ and $t_2$ has to be very accurate in view of the velocity of light in order to enable a precise calculation of the distance to the object. Delays especially varying delays between the current pulse triggering the laser pulse have to be avoided in order to enable a precise determination of $t_1$ and the laser pulse has to be well defined in order to enable precise determination of $t_2$. In further embodiments pulse trains i.e. several laser pulses of different length and or different off-time can be used.

Figure 5:
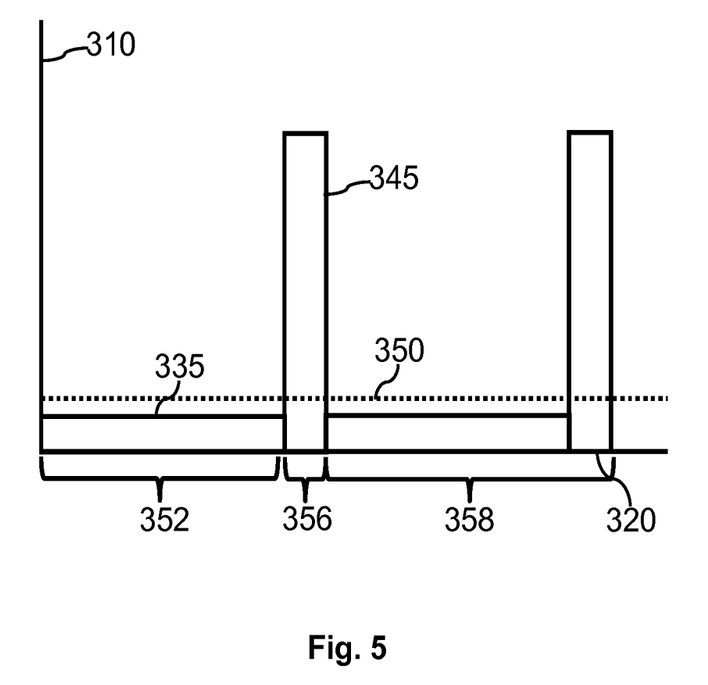
FIG. 5 shows a principal sketch of a first embodiment of a pulse scheme

FIG. 5 shows a principal sketch of a first embodiment of a pulse scheme. The pulse scheme is not drawn to scale. The pulse scheme comprises a pre-current 335 with a pulse length 352 such that the whole time between two laser pulses 345 a current is provided with a current amplitude below the laser threshold current 350 of the V(E)CSEL to which the pre-current 335 is provided. The laser threshold strongly depends on the design of the V(E)CSEL. The pre-current 335 is provided as offset or bias current between the laser pulses 345 and has thus to be below the laser threshold in order to avoid lasing. The laser pulses 345 have a pulse length 356 of 20 ns and are provided with a period of 10 µs (100 kHz repetition frequency). It should be mentioned that the current pulse triggering the laser pulse 345 and the laser pulse 345 are used synonymic in the discussion of FIG. 5 as well as in the discussion of FIGS. 6 and 7. In reality there are slight differences between both wherein it is an object of the invention to minimize or even avoid these differences. The pre-current 335 is adapted such that the thermal lens 140 is formed at the beginning of each laser pulse 345.

The effect of the pre-pulse can approximately be described as follows. The temperature distribution as a function of space and time follows a solution of the differential equation for the heat conduction. A one dimensional solution can be written as $$H(x, t) = \frac{1}{\sqrt{4\pi \cdot a \cdot t}} \exp\left(-\frac{x^2}{4 \cdot a \cdot t}\right)$$

which is in essence a Gaussian distribution in space with $\sigma^2 = 2 \cdot a \cdot t$. The constant $$a = \frac{\lambda}{\rho \cdot c_p}$$

is called the temperature conductivity of the medium and equals the heat conductivity λ divided by the specific density and the heat capacity. For GaAs a=2.4E-5 m²/s.

This means that it takes 1 µs to move a temperature distribution in GaAs by about 10 µm. With a radius of a V(E)CSEL being 50 µm-100 µm and similar values for the thickness of the GaAs substrate it can be concluded that A pulse length of, for example, 10 ns-100 ns is short compared to the temperature conduction i.e. the heat deposited during the pulse defines the temperature distribution at t=0.

It needs about 10 µs to establish a smooth temperature distribution with a maximum in the center across the diameter of the laser aperture. (Strictly speaking the sigma is only about 20 µm after 10 µs but this should be o.k. to get from e.g. a top hat temperature distribution at t=0 to something smooth).

On a similar time scale such temperature distribution has as well established in the closer part of the substrate. The effective thermal lens 140 is related to the integral along the laser beam through all materials. The higher temperature in the center corresponds to a higher refractive index in the center.

Over time such a smooth temperature distribution and the thermal lens 140 establishes as well deeper in the substrate (but obviously the absolute temperature difference or lens is weaker). The larger volume may be more than compensated by the reducing temperature differences and as the heat conduction is three dimensional the differences will reduce fast (in the n-dimensional case the square root in the equation above is replaced by an exponent n/2). Therefore it is expected that the thermal lens 140 is maximum after 1 µs-10 µs and averages out later on.

As the mesa of the V(E)CSEL is soldered to a sub-mount at a typical distance of 5 µm from the active area 103 the heat loss to the substrate of the sub-mount will reduce all temperatures starting from 1 µs after the pulse significantly (heat and temperature conductivity in the sub-mount are higher than in GaAs). This again emphasizes that after a few µs the thermal lens effect has passed its maximum.

After about 100 µs the effect of the thermal lens is expected to be small.

Details also depend on the heat loss and therefore T(x, t=0). If e.g. the losses already follow a Gaussian shape the thermal lens 140 can be established sooner and the maximum is reached at about 1 µs. Furthermore, the diameter of the laser aperture 50 µm-100 µm may be smaller such that the thermal lens can establish even within 100 ns or several hundreds of nanoseconds.

Going back to the pulse shape discussed with respect to FIG. 5 this means that the thermal energy provided by means of the laser pulses 345 provide a major contribution to the formation of the thermal lens 140 in a subsequent laser pulse. This contribution is in case of a time>1-10 µs between two consecutive pulses not sufficient because the thermal energy is already spread over a large volume such that additional thermal energy is needed. This additional energy is locally provided within the laser aperture by means of the offset current of the pre-current 335.

Figure 6:
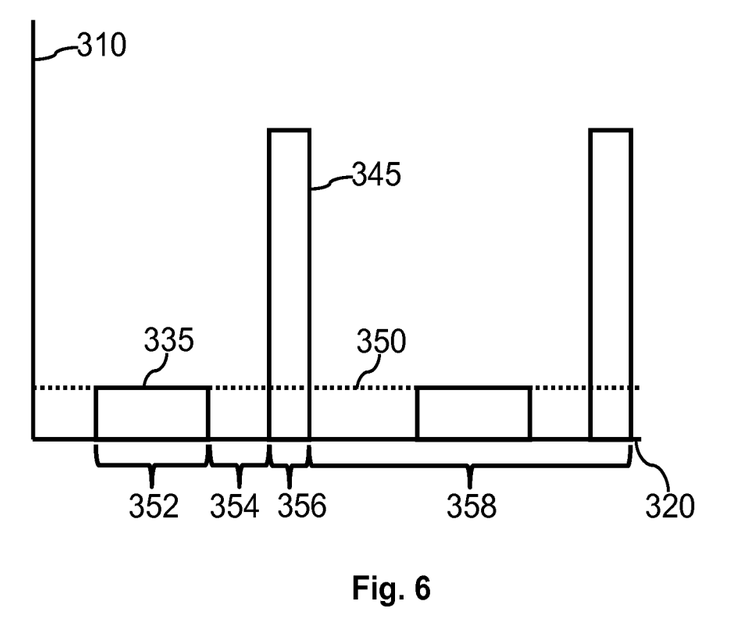
FIG. 6 shows a principal sketch of a second embodiment of the pulse scheme

FIG. 6 shows a principal sketch of a second embodiment of the pulse scheme. The pulse scheme is not drawn to scale. The pulse scheme comprises a pre-current 335 which is provided as a current pre-pulse with a pulse length 352 shorter than the time between two laser pulses 345. There is a period after a laser pulse 345 and a time gap 354 prior to the subsequent laser pulse at which no electrical current is provided to the V(E)CSEL. The current pre-pulse has a current amplitude at 95% (current of 1 Ampere at a voltage of 3 Volt) of the laser threshold current 350 of the V(E)CSEL to which the pre-current 335 is provided. The laser pulses 345 have a pulse length 356 of 2 ns and are provided with a period of 20 µs (50 kHz repetition frequency). The pulse length 352 of the current pre-pulse is 3 µs and the time gap is 50 ns. The total thermal energy provided by means of the current pre-pulse is 9 µJ which is sufficient to heat an isolated mesa of the V(E)CSEL with a diameter of e.g. 210 µm and a laser aperture of around 150 µm by around 60 Kelvin. The length and timing of the current pre-pulse is adapted to the physical structure of the V(E)CSEL and the length and repetition rate of laser pulses 345.

Typical ranges of the current amplitude of the laser pulse are between 1 A and 30 A, preferably between 3 A and 20 A. Typical ranges of the current amplitude of the pre-current are between 0.01 A and 5 A, preferably between 0.1 A and 2 A. The ratio between the current amplitude of the laser pulse and the current amplitude of the pre-current should be bigger than 2, preferably bigger than 5. The pulse length 352 of the laser pulse 345 is between 1 ns and 100 ns, preferably between 2 ns and 10 ns. The pulse length 356 of the pre-current 335 is between 10 ns and 10000 ns, preferably between 100 ns and 5000 ns. The time gap 355 is between 0 ns and 1000 ns. The time period between the laser pulses is preferably between 1 µs and 20 µs, more preferably between 2 µs and 10 µs. For a relatively large diameter (>100 µm) VECSEL the required thermal energy to create a thermal lens is preferably >1 µJ, more preferably >3 µJ.

Figure 7:
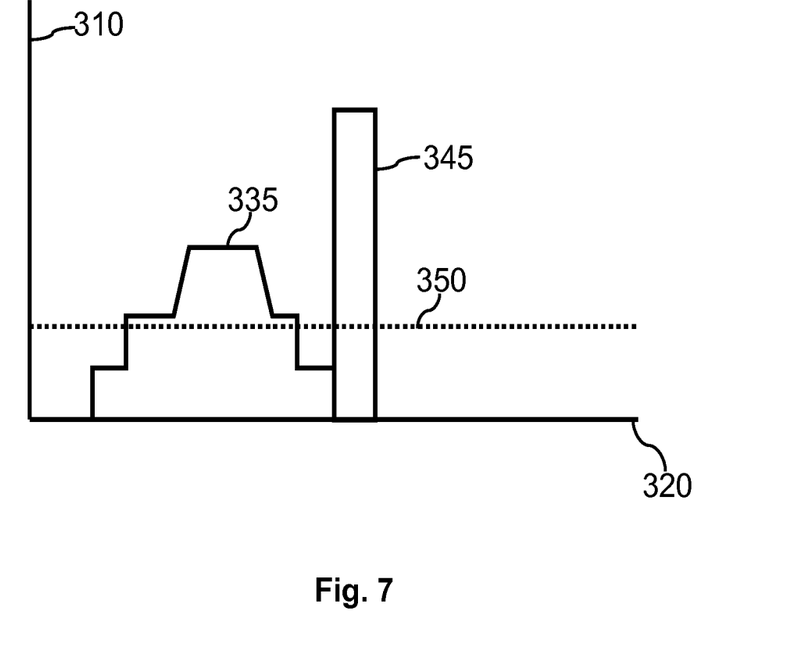
FIG. 7 shows a principal sketch of a third embodiment of the pulse scheme

FIG. 7 shows a principal sketch of a third embodiment of the pulse scheme which is provided to a VECSEL. The pre-current 335 is provided as complex current pre-pulse in which the current amplitude is shortly above the laser threshold. The time period above the laser threshold is that short that there is no time to establish a thermal lens 140. Lasing of the VECSEL is thus avoided during this time period.

Figure 8:
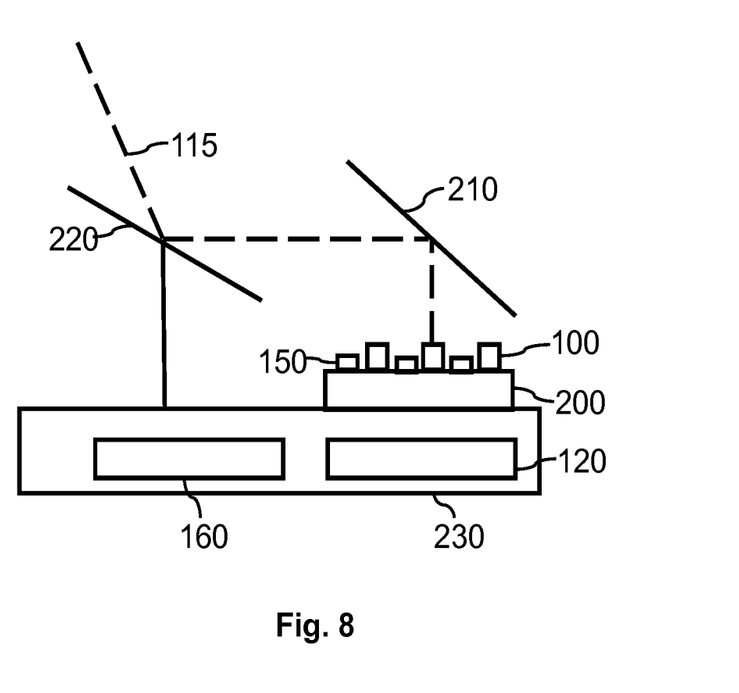
FIG. 8 shows a principal sketch of a second embodiment of the distance detection device

FIG. 8 shows a principal sketch of a second embodiment of the distance detection device. The general configuration of the distance detection device is similar to the configuration of the distance detection device as discussed with respect to FIG. 4. The distance detection device comprises a driving circuit 120 and an evaluator 160 operating in a similar way as described above. The driving circuit 120 and the evaluator 160 are integrate in a mounting structure 200 on which an two-dimensional array of V(E)CSEL 100 and photo-detectors 150 is arranged. The V(E)CSEL provide emitted laser light 115 via a mirror 210 and a scanning mirror 220. Reflected laser light is received by means of the photo-detectors 150 via the scanning mirror 220 and the mirror 210. The scanning mirror 210 is a MEMS-mirror such that emitted laser light 115 of different V(E)CSEL can be emitted to different regions in order to provide 3D information about distances to objects in the environment of the distance detection device which may be mounted on a vehicle like an automobile. The driving circuit 120 provides pre-currents 335 to the V(E)CSEL which are adapted to the relative position of the single V(E)CSEL (e.g. center or edge of the array 200). The pre-currents 335 or current pre-pulses are further adapted such that V(E)CSEL of the array 200 which are controlled by the driving circuit 120 to emit the laser pulses 345 simultaneously start lasing within a pre-defined time period. The predefined time period is related to a thermal cross talk between neighboring V(E)CSEL which are controlled to emit the laser pulse simultaneously. The current pre-pulse is adapted with a duration just long enough to establish a smooth temperature gradient across the laser aperture, but short enough (and not separated in time) to minimize thermal cross talk especially between adjacent mesas of the V(E)CSEL.

Figure 9:
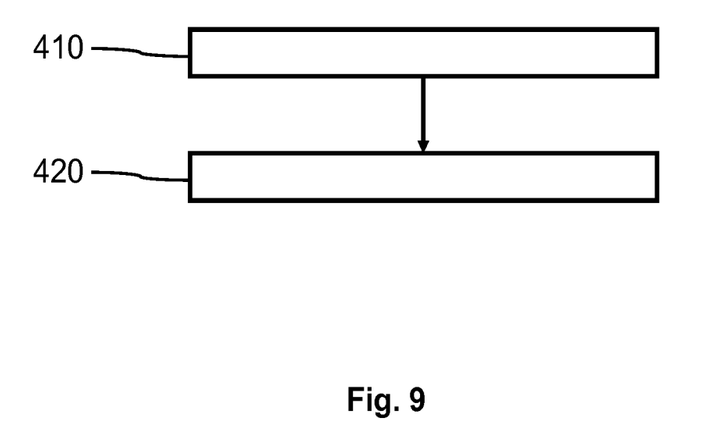
FIG. 9 shows a principal sketch of an embodiment of the method of driving the laser sensor module.

FIG. 9 shows a principal sketch of an embodiment of the method of driving the laser sensor module. In step 410 electrical energy is provided to the Vertical Cavity Surface Emitting Laser such that the Vertical Cavity Surface Emitting Laser emits laser pulses with a pulse length of less than 100 ns and a repetition rate of less than 5% in comparison to a continuous laser emission. In step 420 is additional energy provided to the Vertical Cavity Surface Emitting Laser at least 100 ns prior to at least a part of the laser pulses such that the part of the laser pulses are emitted under defined optical conditions.

It is an object of the present invention to enable reliable time of flight distance measurements by means of V(E)CSEL 100 or V(E)CSEL arrays 200. A thermal lens 140 is provided near to the laser aperture by means of additional energy. The additional energy is preferably provided by means of a current pre-pulse 335 which is applied to the V(E)CSEL prior to preferably each laser pulse 345. The current pre-pulse is preferably arranged such that no laser light is emitted by means of the V(E)CSEL. The V(E)CSEL are enabled to emit the laser pulses 345 under defined optical conditions such that the time of emission and the pulse shape of the laser pulses 345 is well defined. Well defined time of emission and well defined pulse shape of the laser pulses 345 enable a reliable detection of reflected laser light 117 which corresponds to the emission of the respective laser pulse 345.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

| List of reference numerals: | |
|---|---|
| 100 | VCSEL |
| 101 | first electrode |
| 102 | first DBR |
| 103 | active area |
| 104 | second DBR |
| 105 | substrate |
| 106 | second electrode |
| 115 | emitted laser light |
| 117 | reflected laser light |
| 120 | driving circuit |
| 130 | feedback element |
| 140 | thermal lens |
| 150 | photo-detector |
| 160 | evaluator |
| 200 | array |
| 210 | mirror |
| 220 | scanning mirror |
| 230 | mounting structure |
| 310 | intensity |
| 320 | time |
| 335 | pre-current |
| 345 | laser pulse |
| 350 | laser threshold current |
| 352 | pulse length of current pre-pulse |
| 354 | time gap |
| 356 | pulse length of laser pulse |
| 358 | time period between two laser pulses |
| 410 | providing laser pulse |
| 420 | providing current pre-pulse |

The invention claimed is:

1. A laser sensor module comprising:
at least one Vertical Cavity Surface Emitting Laser, the at least one Vertical Cavity Surface Emitting Laser having a laser aperture; and
at least one driving circuit,
wherein the driving circuit is arranged to provide electrical energy to the Vertical Cavity Surface Emitting Laser such that the Vertical Cavity Surface Emitting Laser emits laser pulses,
wherein the laser pulses have a pulse length of less than 100 ns and a duty cycle of less than 5% in comparison to a continuous laser emission,
wherein the driving circuit is arranged to provide additional energy to the Vertical Cavity Surface Emitting Laser at least 100 ns prior to at least a part of the laser pulses such that the part of the laser pulses are emitted under defined optical conditions,
wherein the driving circuit is arranged to provide a pre-current to the Vertical Cavity Surface Emitting Laser in which no laser light is emitted prior to the part of the laser pulses, wherein the pre-current is arranged such that a smooth temperature profile is established across the laser aperture such that a thermal lens is formed at the laser aperture, wherein the Vertical Cavity Surface Emitting Laser is arranged to operate in a stable mode.

2. The laser sensor module according to claim 1, wherein the pre-current comprises at least one current pre-pulse between two subsequent laser pulses.

3. The laser sensor module according to claim 2, wherein the driving circuit is arranged to provide a time gap (354) of at least 10 ns between the current pre-pulse and the laser pulse emitted after the current pre-pulse in which the peak current is less than 50% of a laser threshold current of the Vertical Cavity Surface Emitting Laser is provided to the Vertical Cavity Surface Emitting Laser.

4. The laser sensor module according to claim 1,
wherein the Vertical Cavity Surface Emitting Laser comprises at least one heat management structure,
wherein the heat management structure is arranged to establish the smooth temperature profile across the laser aperture of the Vertical Cavity Surface Emitting Laser between two subsequent laser pulses,
wherein the heat management structure is arranged to increase heat removal at the rim of the laser aperture in comparison to the center of the laser aperture.

5. The laser sensor module according to claim 1, wherein the Vertical Cavity Surface Emitting Laser comprises an optical feedback element.

6. The laser sensor module according to claim 1 further comprising an array of Vertical Cavity Surface Emitting Lasers,
wherein the driving circuit is arranged to provide a pre-current to at least a portion of the Vertical Cavity Surface Emitting Lasers of the array,
wherein the pre-current is arranged such that different pre-currents are provided to at least a first and a second Vertical Cavity Surface Emitting Laser of the array.

7. The laser sensor module according to claim 6 further comprising, wherein the pre-current is arranged relative to the position of the Vertical Cavity Surface Emitting Laser within the array.

8. The laser sensor module according to claim 1 further comprising an array of Vertical Cavity Surface Emitting Lasers,
wherein the driving circuit is arranged to provide a current pre-pulse to at least a part of the Vertical Cavity Surface Emitting Lasers of the array,
wherein the current pre-pulse is arranged such that Vertical Cavity Surface Emitting Lasers which are controlled by the driving circuit to emit the laser pulse start lasing within a predefined time period,
wherein the predefined time period is related to a thermal cross talk between neighboring Vertical Cavity Surface Emitting Lasers.

9. A laser sensor module comprising:
at least one Vertical Cavity Surface Emitting Laser, the at least one Vertical Cavity Surface Emitting Laser having a laser aperture; and
at least one driving circuit,
wherein the driving circuit is arranged to provide electrical energy to the Vertical Cavity Surface Emitting Laser such that the Vertical Cavity Surface Emitting Laser emits laser pulses,
wherein the laser pulses have a pulse length of less than 100 ns and a duty cycle of less than 5% in comparison to a continuous laser emission,
wherein the driving circuit is arranged to provide additional energy to the Vertical Cavity Surface Emitting Laser at least 100 ns prior to at least a part of the laser pulses such that the part of the laser pulses are emitted under defined optical conditions,
wherein the driving circuit is arranged to provide a pre-current to the Vertical Cavity Surface Emitting Laser in which no laser light is emitted prior to the part of the laser pulses,
wherein the pre-current is arranged such that a smooth temperature profile is established across the laser aperture such that a thermal lens is formed at the laser aperture,
wherein a temperature difference between a center of the laser aperture and a rim of the laser aperture at the beginning of emission of the part of the laser pulses is at least 2 K.

10. A laser sensor module comprising:
at least one Vertical Cavity Surface Emitting Laser, the at least one Vertical Cavity Surface Emitting Laser having a laser aperture; and
at least one driving circuit,
wherein the driving circuit is arranged to provide electrical energy to the Vertical Cavity Surface Emitting Laser such that the Vertical Cavity Surface Emitting Laser emits laser pulses,
wherein the laser pulses have a pulse length of less than 100 ns and a duty cycle of less than 5% in comparison to a continuous laser emission,
wherein the driving circuit is arranged to provide additional energy to the Vertical Cavity Surface Emitting Laser at least 100 ns prior to at least a part of the laser pulses such that the part of the laser pulses are emitted under defined optical conditions,
wherein the driving circuit is arranged to provide a pre-current to the Vertical Cavity Surface Emitting Laser in which no laser light is emitted prior to the part of the laser pulses,
wherein the pre-current is arranged such that a smooth temperature profile is established across the laser aperture such that a thermal lens is formed at the laser aperture,
wherein the pre-current comprises a constant offset current provided between two laser pulses.

11. A laser sensor module comprising:
at least one Vertical Cavity Surface Emitting Laser, the at least one Vertical Cavity Surface Emitting Laser having a laser aperture; and
at least one driving circuit,
wherein the driving circuit is arranged to provide electrical energy to the Vertical Cavity Surface Emitting Laser such that the Vertical Cavity Surface Emitting Laser emits laser pulses,
wherein the laser pulses have a pulse length of less than 100 ns and a duty cycle of less than 5% in comparison to a continuous laser emission,
wherein the driving circuit is arranged to provide additional energy to the Vertical Cavity Surface Emitting Laser at least 100 ns prior to at least a part of the laser pulses such that the part of the laser pulses are emitted under defined optical conditions,
wherein the driving circuit is arranged to provide a pre-current to the Vertical Cavity Surface Emitting Laser in which no laser light is emitted prior to the part of the laser pulses, wherein the pre-current is arranged such that a smooth temperature profile is established across the laser aperture such that a thermal lens is formed at the laser aperture, wherein the pre-current comprises at least one current pre-pulse between two subsequent laser pulses, wherein the current pre-pulse comprises a maximum current amplitude which is higher than a laser threshold current of the Vertical Cavity Surface Emitting Laser.

12. A distance detection device comprising:
at least one laser sensor module, the at least one laser sensor module comprising:
at least one Vertical Cavity Surface Emitting Laser, the at least one Vertical Cavity Surface Emitting Laser having a laser aperture; and
at least one driving circuit,
wherein the driving circuit is arranged to provide electrical energy to the Vertical Cavity Surface Emitting Laser such that the Vertical Cavity Surface Emitting Laser emits laser pulses,
wherein the laser pulses have a pulse length of less than 100 ns and a duty cycle of less than 5% in comparison to a continuous laser emission,
wherein the driving circuit is arranged to provide additional energy to the Vertical Cavity Surface Emitting Laser at least 100 ns prior to at least a part of the laser pulses such that the part of the laser pulses are emitted under defined optical conditions,
wherein the driving circuit is arranged to provide a pre-current to the Vertical Cavity Surface Emitting Laser in which no laser light is emitted prior to the part of the laser pulses,
wherein the pre-current is arranged such that a smooth temperature profile is established across the laser aperture such that a thermal lens is formed at the laser aperture,
at least one photo-detector, wherein the at least one photo-detector is arranged to receive reflected laser light of at least one laser pulse,
an evaluator,
wherein the evaluator is arranged to identify reflected laser light of a corresponding laser pulse,
wherein the evaluator is arranged to determine a time of flight,
wherein the time of flight is the time between a time of reception of the reflected laser light and a time of emission of the corresponding laser pulse.

13. A method of driving a laser sensor module for time of flight measurements comprising at least one Vertical Cavity Surface Emitting Laser, the method comprising:
providing electrical energy to the Vertical Cavity Surface Emitting Laser such that the Vertical Cavity Surface Emitting Laser emits laser pulses, wherein each pulse has a pulse length of less than 100 ns and a repetition rate of less than 5% in comparison to a continuous laser emission;
providing additional energy by means of a pre-current to the Vertical Cavity Surface Emitting Laser at least 100 ns prior to at least a part of the laser pulses in which no laser light is emitted prior to the part of the laser such that the part of the laser pulses are emitted under defined optical conditions,
arranging the pre-current such that a smooth temperature profile is established across a laser aperture of the Vertical Cavity Surface Emitting Laser such that a thermal lens is formed at the laser aperture,
operating the Vertical Cavity Surface Emitting Laser in a stable mode.

14. The method according to claim 13, wherein the method further comprises:
determining a first thermal energy generated in the Vertical Cavity Surface Emitting Laser during emission of the laser pulse;
determining the additional energy to be provided;
determining a pulse shape of a pre-current based on the determined additional energy.

* * * * *